United States Patent
Pisek et al.

(10) Patent No.: US 7,802,170 B2
(45) Date of Patent: Sep. 21, 2010

(54) UNIFIED STOPPING CRITERIA FOR BINARY AND DUOBINARY TURBO DECODING IN A SOFTWARE-DEFINED RADIO SYSTEM

(75) Inventors: Eran Pisek, Plano, TX (US); Jasmin Oz, Plano, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 956 days.

(21) Appl. No.: 11/635,832

(22) Filed: Dec. 8, 2006

(65) Prior Publication Data

US 2007/0300139 A1 Dec. 27, 2007

Related U.S. Application Data

(60) Provisional application No. 60/812,681, filed on Jun. 9, 2006.

(51) Int. Cl.
 *H03M 13/03* (2006.01)
(52) U.S. Cl. .................................. 714/786; 375/340
(58) Field of Classification Search ................ 714/786; 375/340

See application file for complete search history.

(56) References Cited

U.S. PATENT DOCUMENTS

2003/0110438 A1* 6/2003 Pan et al. .................... 714/755

* cited by examiner

*Primary Examiner*—Sam Rizk

(57) ABSTRACT

A decoding process for decoding a received block of N systematic binary data samples or N systematic duobinary data samples using a maximum a posteriori probability (MAP) decoding algorithm. The decoding process calculates a set of four log-likelihood values using the corresponding forward state metric, reverse state metric, and branch metric values for each of N/2 pairs of systematic binary data or each of N/2 pairs of duobinary data in the received block. The decoding process also calculates, for each set of four log-likelihood values a delta value corresponding to the difference between the largest and the second largest of the four log-likelihood values in each set. The decoding process repeats for at least a second iteration. The decoding process is stopped based on a plurality of delta values calculated during two consecutive iterations.

24 Claims, 10 Drawing Sheets

UNIFIED STOPPING CRITERIA FOR BINARY AND DUOBINARY TURBO DECODING IN A SOFTWARE-DEFINED RADIO SYSTEM

CROSS-REFERENCE TO RELATED APPLICATION AND CLAIM OF PRIORITY

This application is related to U.S. Provisional Patent No. 60/812,681, filed Jun. 9, 2006, entitled "Unified Stopping Criteria For Binary and Duobinary Decoding." Provisional Patent No. 60/812,681 is assigned to the assignee of this application and is incorporated by reference as if fully set forth herein. This application claims priority under 35 U.S.C. §119(e) to Provisional Patent No. 60/812,681.

This application is related to U.S. patent application Ser. No. 11/123,313, filed on May 6, 2005, entitled "Context-based Operation Reconfigurable Instruction Set Processor and Method of Operation" and to U.S. patent application Ser. No. 11/501,335, filed Aug. 9, 2006, entitled "Generic Maximum Aposteriori Probability Decoder For Use In Software-Defined Radio Systems." application Ser. Nos. 11/123,313 and 11/501,335 are assigned to the assignee of this application and are incorporated by reference into this application as if fully set forth herein.

TECHNICAL FIELD OF THE INVENTION

The present application relates generally to decoding algorithms and, more specifically, to a reconfigurable channel decoder using a unified stopping criteria for binary and duobinary data.

BACKGROUND OF THE INVENTION

Many wireless communication standards use block codes, such as turbo codes, to increase the performance of channel decoding. In block coding techniques, the encoding and decoding processes are done on a block-by-block basis. Many standards, such as WiBro, CDMA2000 and WCDMA, use turbo encoding and decoding functions that handle different block sizes, spanning from a few bits to 20 kilobits (e.g., CDMA2000).

The performance of a channel decoder is significantly impacted by the stopping criteria used to halt execution of the decoding algorithm. A considerable amount of literature discusses stopping criteria for binary data turbo decoding. Some conventional binary data standards (e.g., WCDMA) have stopping criteria based on the mean and/or minimum log-likelihood values. Other binary data stopping criteria use a threshold value for the log-likelihood which must be reached by a pre-defined fraction of the binary data.

Prior art references also discuss stopping criteria for duobinary turbo decoding. Some duobinary systems (e.g., WiBro) implement a stopping criterion based on the consistency of the decoded hard bits. Other duobinary stopping criteria are based on the values of the forward state metric.

However, there is no literature available on unified stopping criteria for reconfigurable wireless communication devices (e.g., software-defined radio (SDR) systems) that are capable of both binary and duobinary turbo decoding.

Therefore, there is a need in the art for an improved reconfigurable decoder for use in a software-defined radio (SDR) system. In particular, there is a need for a unified stopping criteria that may be used by a reconfigurable decoder to terminate the decoding of either binary data (e.g., WCDMA mode) or duobinary data (e.g., WiBro data).

SUMMARY OF THE INVENTION

A new technique is disclosed for the turbo decoding of binary data and duobinary data using unified stopping criteria. The unified stopping criteria define a new parameter, $\Delta$ (delta), which is defined as the difference between the largest value and the second largest value in a set of four duobinary log-likelihoods derived from a pair of consecutive binary data bits or from a duobinary data pair. This parameter behaves nearly identically to the block-averaged binary absolute value of the log-likelihood. Due to this similarity, the stopping criteria for binary and duobinary turbo decoding may be unified. The stopping rules for binary turbo decoding that are based on the binary log-likelihood may be directly employed in the case of duobinary turbo decoding, thereby replacing the binary log-likelihood with the delta ($\Delta$) value. The new technique may also compare the current delta value to the previous (half) iteration delta value and stop the decoding if the delta value has decreased or the differences between the delta values did not pass a certain value (i.e., a slope value).

The present disclosure also proposes a new stopping criterion based on two thresholds instead of one. The iteration process is stopped unless 50% (or other percentage) of the delta values lie between the lower and upper thresholds for two (or more) consecutive iterations (also half iterations). This criterion ensures that iterations continue if and only if the iteration process is improving the bit error rate and the desired target bit error rate has not been reached yet. The new stopping criterion, applicable for both binary and duobinary turbo decoding, monitors the progression of the iterations and the desired target bit error rate simultaneously.

Accordingly, in one embodiment, a decoding process is disclosed for decoding a received block of N systematic binary data samples or N systematic duobinary data samples using a maximum a posteriori probability (MAP) decoding algorithm. The decoding process comprising the steps of: a) for each of N/2 pairs of systematic binary data samples in the received block or each of N/2 pairs of duobinary data samples in the received block, calculating a set of four log-likelihood ($\lambda_{00}$, $\lambda_{01}$, $\lambda_{10}$, $\lambda_{11}$) values using the corresponding forward state metric ($\alpha$) values, reverse state metric ($\beta$) values, and branch metric ($\gamma$) values; and b) for each set of four log-likelihood ($\lambda_{00}$, $\lambda_{01}$, $\lambda_{10}$, $\lambda_{11}$) values calculated in step a), calculating a delta value corresponding to the difference between the largest and the second largest of the four log-likelihood ($\lambda_{00}$, $\lambda_{01}$, $\lambda_{10}$, $\lambda_{11}$) values in each set. The decoding process repeats steps a) and b) for at least a second iteration. The decoding process is stopped based on a plurality of delta values calculated during two consecutive iterations of steps a) and b).

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 9, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged processing system.

In the descriptions that follow, the reconfigurable maximum a posteriori probability (MAP) decoder disclosed herein is implemented as part of a turbo decoder that provides a high degree of parallelism to support high data rate standards and that has reduce intermediate result memory requirements. The exemplary turbo decoder was disclosed in U.S. patent application Ser. No. 11/225,479, incorporated by reference above. However, it will be understood that the embodiment of the reconfigurable maximum a posteriori probability (MAP) decoder in a turbo decoder is by way of illustration only and should not be construed to limit the scope of this disclosure. The reconfigurable MAP decoder having reduced intermediate result memory requirements disclosed herein may easily be adapted for use in decoders other that turbo decoders.

The reconfigurable MAP decoder and the reconfigurable turbo decoder support multimode operation for decoding in different communication standards, including WCDMA, CDMA2000, IEEE-802.16e (i.e., WiBro), among others. The disclosed MAP and turbo decoders also provide adaptability to support different data rates. WiBro and WCDMA/HSDPA operate at many different data rates. The disclosed MAP and turbo decoder architectures are optimized not only for the maximum data rates but also for different ranges of data rate.

In one embodiment of the disclosure, the reconfigurable MAP and turbo decoders described herein may be implemented using a context-based operation reconfigurable instruction set processor (CRISP) device. CRISP devices are described in detail in U.S. patent application Ser. No. 11/123,313, which was incorporated by reference above.

The present disclosure introduces a novel method of segmenting the received data block in the receiver. The block decoder operates on the segments without requiring intervention from the host side. The present disclosure uses three (3) registers that hold values defining the block segmentation process: the Segment Size register, the Segment Count register and the Window Size register. Although the unique segmentation process is implemented in a turbo decoder in the embodiments described herein, this is by way of illustration only and should not be construed so as to limit the scope of the present disclosure. Those skilled in the art will appreciate that the segmentation process disclosed herein may easily be adapted for use in other types of block decoder.

Figure 1:
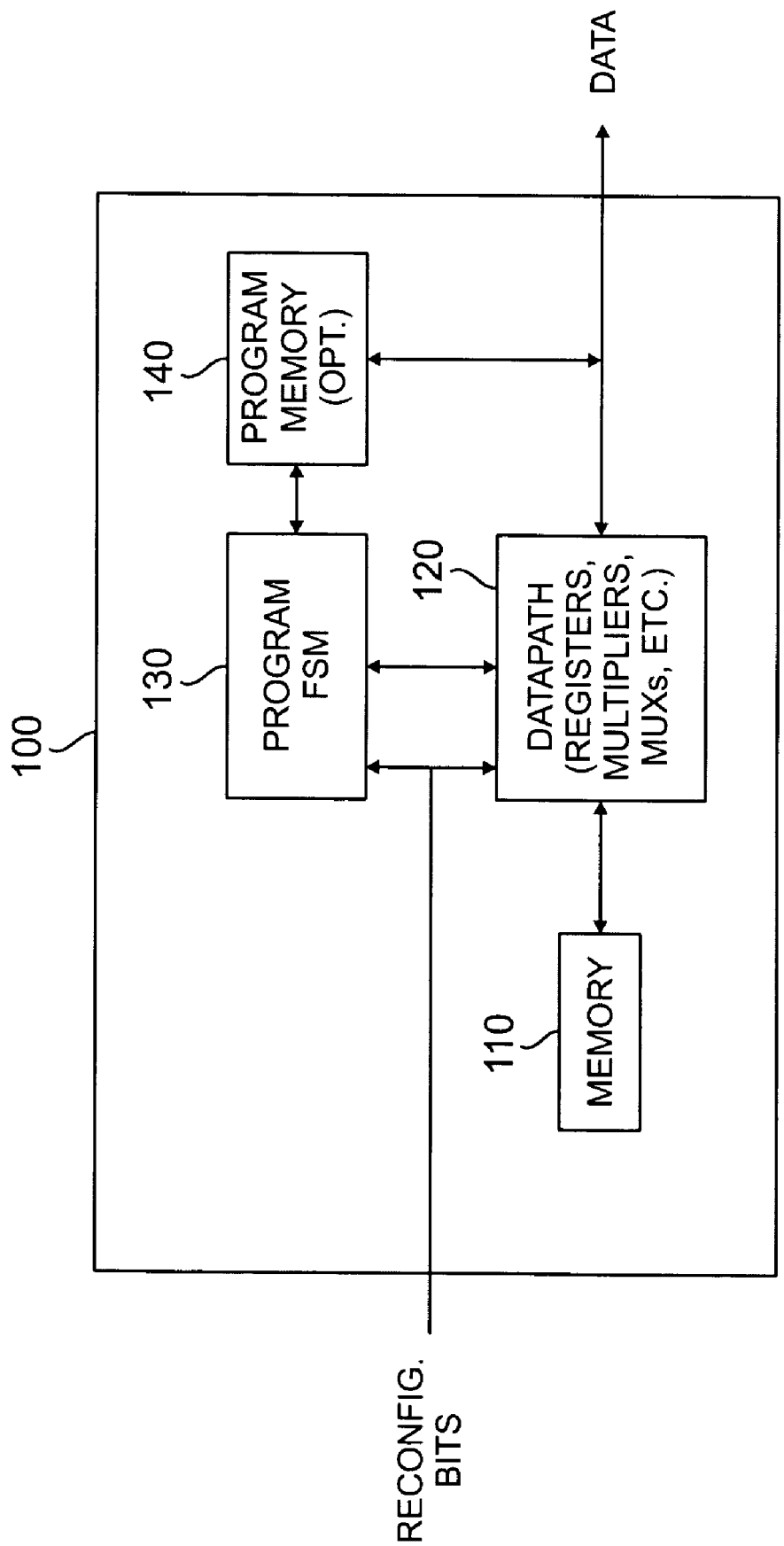
FIG. 1 is a high-level block diagram of a CRISP device that may be used to implement a reconfigurable decoder that uses unified stopping criteria.

FIG. 1 is a high-level block diagram of context-based operation reconfigurable instruction set processor (CRISP) 100, which may be used to implement a reconfigurable maximum a posteriori probability (MAP) decoder that uses unified stopping criteria according to the principles of the present disclosure. CRISP 100 comprises memory 110, programmable data path circuitry 120, programmable finite state machine 130, and optional program memory 140. A context is a group of instructions of a data processor that are related to a particular function or application, such as turbo decoding instructions. As described in U.S. patent application Ser. No. 11/123,313, CRISP 100 implements only a subset of context-related instructions in an optimum manner.

Context-based operation reconfigurable instruction set processor (CRISP) 100 defines the generic hardware block that usually consists of higher level hardware processor blocks. The principle advantage to CRISP 100 is that CRISP 100 breaks down the required application into two main domains, a control domain and a data path domain, and optimizes each domain separately. By performing turbo decoding in CRISP 100, the disclosed turbo decoder reduces the problems related to flexibility and power consumption that affect conventional turbo decoders.

The control domain is implemented by programmable finite state machine 130, which may comprise a DSP, an MCU or another prior art device. Programmable FSM 130 is configured by reconfiguration bits received from an external controller (not shown). Programmable FSM 130 may execute a program stored in associated optional program memory 140. The program may be stored in program memory 140 via the DATA line from an external controller (not shown). Memory 110 is used to store application data used by data path circuitry 120.

Programmable data path circuitry 120 is divided into sets of building blocks that perform particular functions (e.g., registers, multiplexers, multipliers, and the like). Each of the building blocks is both reconfigurable and programmable to allow maximum flexibility. The division of programmable data path circuitry 120 into functional blocks depends on the level of reconfigurability and programmability required for a particular application.

Since different contexts are implemented by separate CRISP devices that work independently of other CRISP devices, implementing a turbo decoder using one or more CRISP devices provides an efficient power management scheme that is able to shut down a CRISP when the CRISP is not required. This assures that only the CRISPs that are needed at a given time are active, while other idle CRISPs do not consume significant power.

Figure 2:
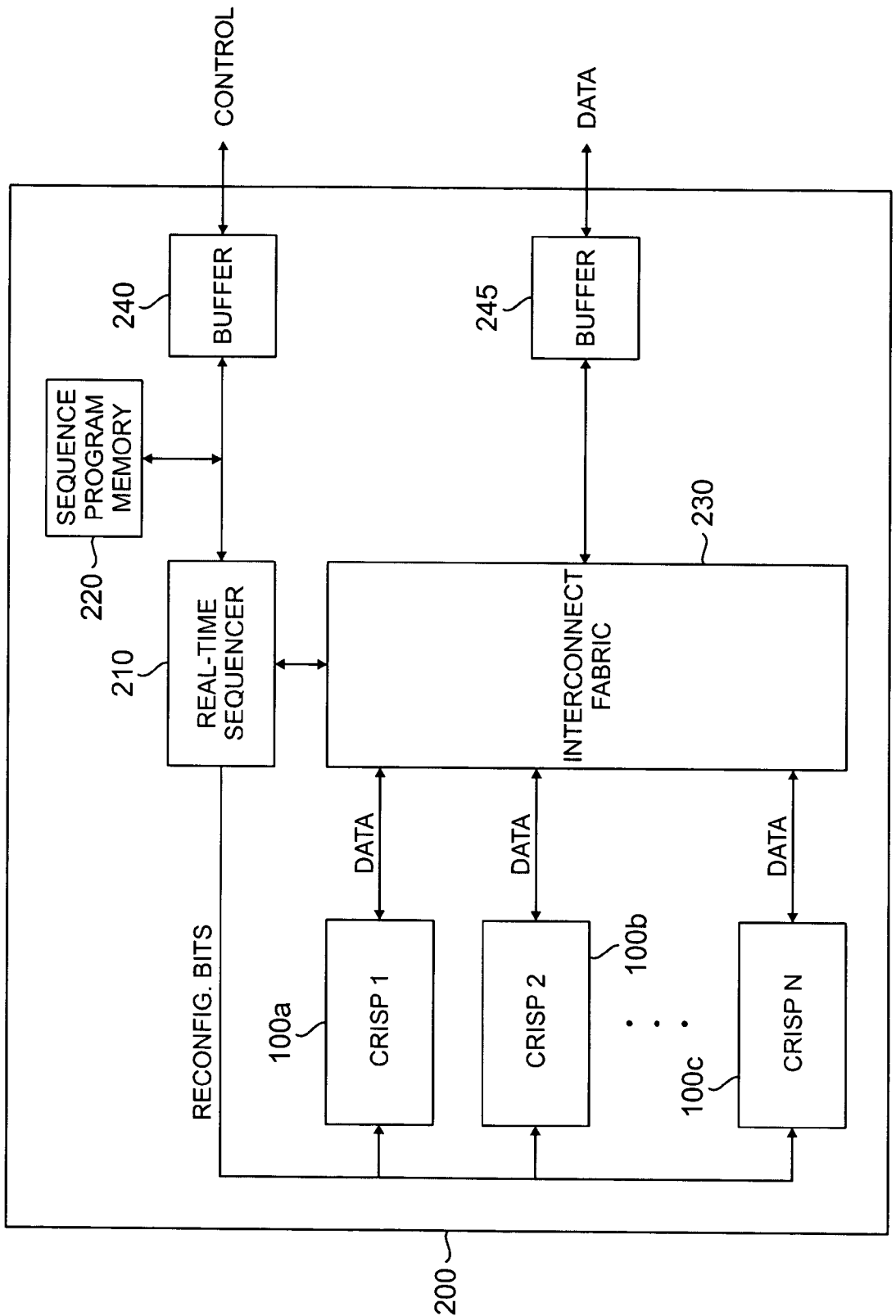
FIG. 2 is a high-level block diagram of a reconfigurable processing system.

FIG. 2 is a high-level block diagram of reconfigurable processing system 200 according to one embodiment of the present disclosure. Reconfigurable processing system 200 comprises N context-based operation reconfigurable instruction set processors (CRISPs), including exemplary CRISPs 100a, 100b, and 100c, which are arbitrarily labeled CRISP 1, CRISP 2 and CRISP N. Reconfigurable processing system 200 further comprises real-time sequencer 210, sequence program memory 220, programmable interconnect fabric 230, and buffers 240 and 245.

Reconfiguration bits may be loaded into CRISPs 100a, 100b, and 100c from the CONTROL line via real-time sequencer 210 and buffer 240. A control program may also be loaded into sequence program memory 220 from the CONTROL line via buffer 240. Real-time sequencer 210 sequences the contexts to be executed by each one of CRISPs 100a-c by retrieving program instructions from program memory 220 and sending reconfiguration bits to CRISPs 100a-c. In an exemplary embodiment, real-time sequencer 210 may comprise a stack processor, which is suitable to operate as a real-time scheduler due to its low latency and simplicity.

Reconfigurable interconnect fabric 230 provides connectivity between each one of CRISPs 100a-c and an external DATA bus via bi-directional buffer 245. In an exemplary embodiment of the present disclosure, each one of CRISPs 100a-c may act as a master of reconfigurable interconnect fabric 230 and may initiate address access. The bus arbiter for reconfigurable interconnect fabric 230 may be internal to real-time sequencer 210.

In an exemplary embodiment, reconfigurable processing system 200 may be, for example, a cell phone or a similar wireless device, or a data processor for use in a laptop computer. In a wireless device embodiment based on a software-defined radio (SDR) architecture, each one of CRISPs 100a-c is responsible for executing a subset of context-related instructions that are associated with a particular reconfigurable function. For example, CRISP 100a may be configured to execute context-related instructions that process CDMA baseband signals or OFDMA baseband signals. CRISP 100b may be configured to execute context-related instructions that act as a memory controller. CRISP 100c may be configured to execute context-related instructions that perform turbo decoding or Viterbi decoding.

Since CRISP devices are largely independent and may be run simultaneously, a turbo decoder implemented using one or more CRISP devices has the performance advantage of parallelism without incurring the full power penalty associated with running parallel operations. The loose coupling and independence of CRISP devices allows them to be configured for different systems and functions that may be shut down separately.

Figure 3:
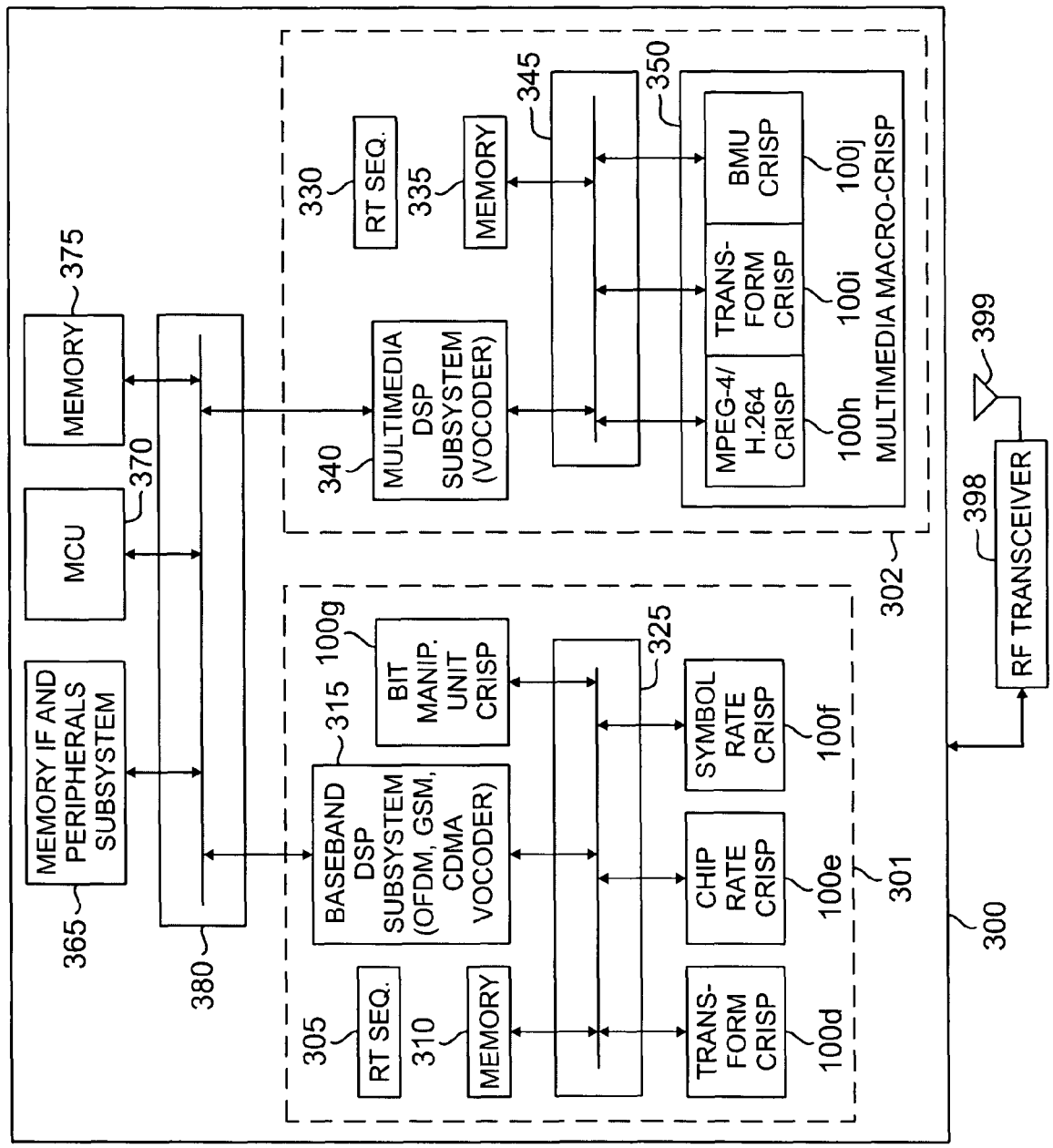
FIG. 3 is a high-level block diagram of a multi-standard software-defined radio (SDR) system that implements a reconfigurable decoder that uses unified stopping criteria.

FIG. 3 is a high-level block diagram of multi-standard software-defined radio (SDR) system 300, which implements a reconfigurable maximum a posteriori probability (MAP) decoder that uses unified stopping criteria. SDR system 300 may comprise a wireless terminal (or mobile station, subscriber station, etc.) that accesses a wireless network, such as, for example, a GSM or CDMA cellular telephone, a PDA with WCDMA, IEEE-802.11x, OFDM/OFDMA capabilities, or the like.

Multi-standard SDR system 300 comprises baseband subsystem 301, applications subsystem 302, memory interface (IF) and peripherals subsystem 365, main control unit (MCU) 370, memory 375, and interconnect 380. MCU 370 may comprise, for example, a conventional microcontroller or a microprocessor (e.g., x86, ARM, RISC, DSP, etc.). Memory IF and peripherals subsystem 365 may connect SDR system 300 to an external memory (not shown) and to external peripherals (not shown). Memory 375 stores data from other components in SDR system 300 and from external devices (not shown). For example, memory 375 may store a stream of incoming data samples associated with a down-converted signal generated by radio frequency (RF) transceiver 398 and antenna 399 associated with SDR system 300. Interconnect 380 acts as a system bus that provides data transfer between subsystems 301 and 302, memory IF and peripherals subsystem 365, MCU 370, and memory 375.

Baseband subsystem 301 comprises real-time (RT) sequencer 305, memory 310, baseband DSP subsystem 315, interconnect 325, and a plurality of special purpose context-based operation instruction set processors (CRISPs), including transform CRISP 100d, chip rate CRISP 100e, symbol rate CRISP 100f, and bit manipulation unit (BMU) CRISP 100g. By way of example, transform CRISP 100d may implement a Fast Fourier Transform (FFT) function, chip rate CRISP 100e may implement a correlation function for a CDMA signal, and symbol rate CRISP 100f may implement a turbo decoder function or a Viterbi decoder function.

In such an exemplary embodiment, transform CRISP 100d may receive samples of an intermediate frequency (IF) signal stored in memory 375 and perform an FFT function that generates a sequence of chip samples at a baseband rate. Next, chip rate CRISP 100e receives the chip samples from transform CRISP 100d and performs a correlation function that generates a sequence of data symbols. Next, symbol rate CRISP 100f receives the symbol data from chip rate CRISP 100e and performs turbo decoding or Viterbi decoding to recover the baseband user data. The baseband user data may then be used by applications subsystem 302.

In an exemplary embodiment of the present disclosure, symbol rate CRISP 100f may comprise two or more CRISPs that operate in parallel. Also, by way of example, BMU CRISP 100g may implement such functions as variable length coding, cyclic redundancy check (CRC), convolutional encoding, and the like. Interconnect 325 acts as a system bus that provides data transfer between RT sequencer 305, memory 310, baseband DSP subsystem 315 and CRISPs 100d-100g.

Applications subsystem 302 comprises real-time (RT) sequencer 330, memory 335, multimedia DSP subsystem 340, interconnect 345, and multimedia macro-CRISP 350. Multimedia macro-CRISP 350 comprises a plurality of special purpose context-based operation instruction set processors, including MPEG-4/H.264 CRISP 550h, transform CRISP 550i, and BMU CRISP 100j. In an exemplary embodiment of the disclosure, MPEG-4/H.264 CRISP 550h performs motion estimation functions and transform CRISP 100h performs a discrete cosine transform (DCT) function. Interconnect 380 provides data transfer between RT sequencer 330, memory 335, multimedia DSP subsystem 340, and multimedia macro-CRISP 350.

In the embodiment in FIG. 3, the use of CRISP devices enables applications subsystem 302 of multi-standard SDR system 300 to be reconfigured to support multiple video standards with multiple profiles and sizes. Additionally, the use of CRISP devices enables baseband subsystem 301 of multi-standard SDR system 300 to be reconfigured to support multiple air interface standards. Thus, SDR system 300 is able to operate in different types of wireless networks (e.g., CDMA, GSM, 802.11x, etc.) and can execute different types of video and audio formats. However, the use of CRISPS according to the principles of the present disclosure enables SDR system 300 to perform these functions with much lower power consumption than conventional wireless devices having comparable capabilities.

Figure 4A:
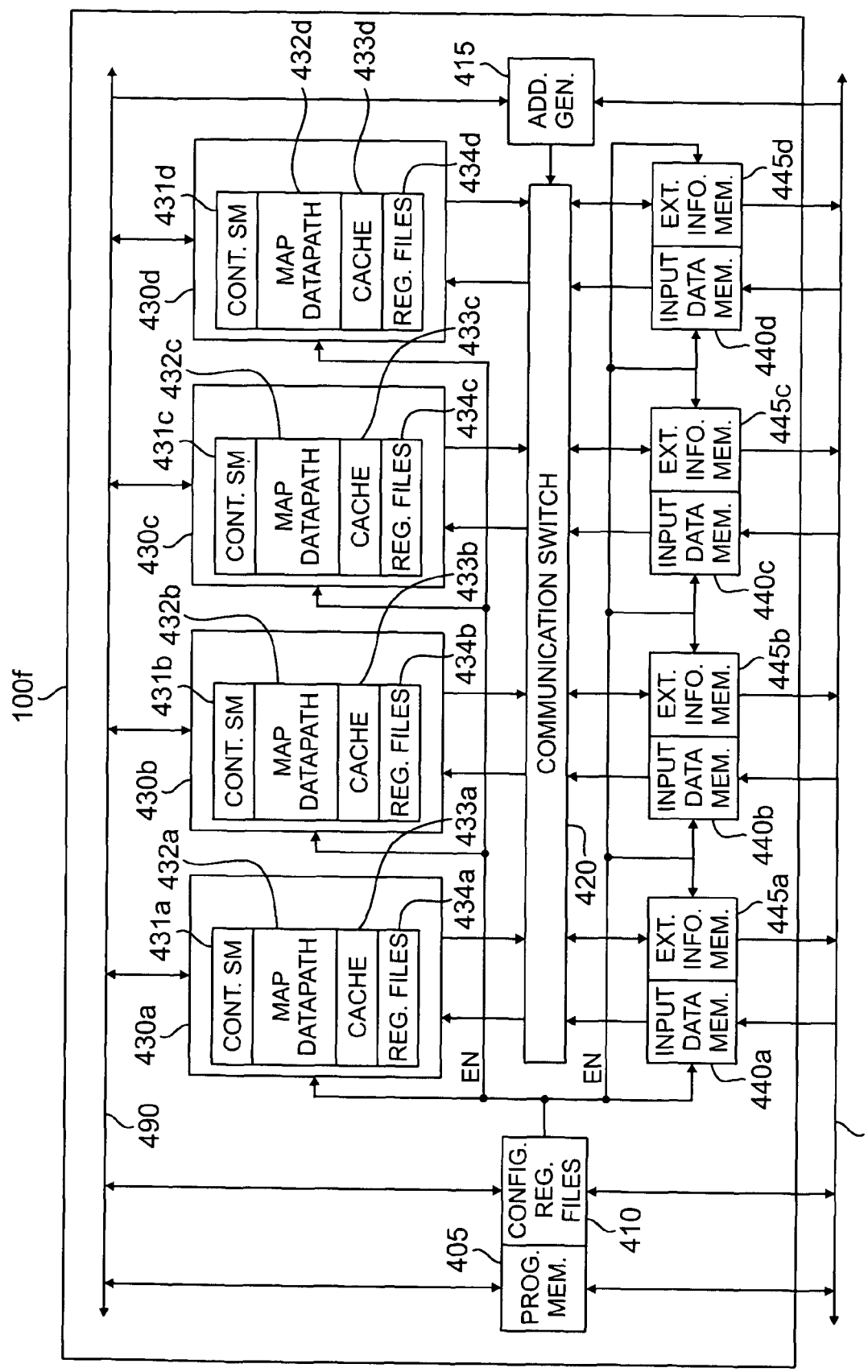
FIG. 4A is a block diagram of a reconfigurable turbo decoder implemented in a CRISP according to the principles of the disclosure.

FIG. 4A is a block diagram of a reconfigurable turbo decoder implemented in CRISP 100f according to the principles of the disclosure. Turbo decoder CRISP 100f comprises program memory 405, configuration register files 410, address generator 415, communication switch 420, processing units 430a-430d, input data memories 440a-440d, extrinsic information memories 445a-445d, and internal bus 490. Each one of processing units 430a-430d comprises a control state machine (SM), a maximum a posteriori probability (MAP) datapath, a cache, and control register files. By way of example, processing unit 430 comprises control state machine 431a, MAP datapath 432a, cache 433a, and control register files 434a. Although four processing units 430 are illustrated in FIG. 4A, this is by way of example only. Other embodiments of turbo decoder CRISP 100f may implement less than four processing units 430 or more than four processing units 430.

A conventional MAP turbo decoder architecture generally comprises two primary functional blocks: i) soft-input, soft-output (SISO) stages that implement an a posteriori probability (APP) algorithm; and ii) an interleaver/deinterleaver that scrambles the data according to the interleaving rules followed by the encoder in the transmitting device. Other blocks are required for the implementation of the decoder, such as a RAM (random-access memory) for storing data from each iteration of the decoder. Turbo decoder CRISP 100f includes all the building blocks of a conventional MAP turbo decoder. In an exemplary embodiment, each one of MAP datapaths 432a-432d implements a sliding window MAP algorithm. However, alternate embodiments of turbo decoder CRISP 100f may implement non-sliding window MAP algorithms.

In turbo decoder CRISP loaf, MAP datapaths 432a, 432b, 432c and 432d temporarily store the values of $\alpha$ (alpha), $\beta$ (beta), and $\lambda$ (lambda) in caches 433a, 433b, 433c, and 433d. The extrinsic information (i.e., the $\lambda$ values) from each iteration for each decoding block is stored in extrinsic information memories 445a, 445b, 445c and 445d via communication switch 420. In an exemplary embodiment, MCU 370 loads a configuration program and configuration data into turbo decoder CRISP 100f via an external system bus (i.e., interconnect 325). The configuration program is stored in program memory 405. MCU 370 loads the configuration data into configuration register files 410 and control register files 434a-434d in order to initialize the register files. Configuration register files 410 and control register files 434a-434d are used to control which processing units 430a-430d, input data memories 440a-440d, and extrinsic information memories 445a-445d are used in an application. Configuration register files 410 provide enable (EN) signals to control processing units 430, input data memories 440, and extrinsic information memories 445. Turbo decoder CRISP 100f reads input data samples and writes decoded output data via the system bus (i.e., interconnect 325).

In order to achieve high decoding rates, turbo decoder CRISP 100f implements N parallel processing units 430a-430d. In this example, N=4. Processing units 430a-430d are independent and identical to each other. Each one of processing units 430a-430d is capable of connecting to each one of input data memories 440a-440d and extrinsic information memories 445a-445d via communication switch 420. For higher data rate standards, all of processing units 430a-430d may operate simultaneously and in parallel. For lower data rate standards, one or more of processing units 430a-430d may be set to a sleep mode (i.e., deactivated or disabled) in order to reduce power consumption.

As noted above, each one of processing units 430a-430d comprises control state machine 431, MAP datapath 432, cache 433 and control register files 434. In an exemplary embodiment of turbo decoder CRISP 100f, each processing unit 430 processes two soft input data samples at a time. The two soft input data samples correspond to two data symbols. In an exemplary embodiment, each soft input data sample may comprise 8 bits. MAP datapath 432 performs both forward and backward recursions over the trellis. During the forward recursion and optionally also during the backward recursion, both the input symbol and the extrinsic ($\lambda$) information must be accessed to compute the branch metric, $\gamma$ (gamma). In order to reduce memory access power consumption, the $\gamma$ value may be computed and stored in cache 433 in each processing unit 430. If the values of $\alpha$, $\beta$, and $\lambda$ are not calculated simultaneously, the $\alpha$ value may also be stored in cache 430 to reduce data movement and power consumption.

MAP datapath 432 may compute the $\alpha$, $\beta$, and $\lambda$ values in parallel or in consecutive (or sequential) order. Parallel execution is faster, but requires more die space and power consumption. Consecutive processing incurs longer delays, but requires less die space and less power consumption. In an exemplary embodiment, each one of MAP datapaths 430a-430d computes the $\alpha$, $\beta$, and $\lambda$ values sequentially. Control state machine 431 decodes instructions from program memory received via internal bus 490 and controls the overall operation and configuration of processing unit 430. Since turbo decoder CRISP 100f may compute large instruction loops, control state machine 431 may use a hardware loop to reduce overhead and power consumption.

There are eight memory blocks in turbo decoder CRISP 100f: four input data memories 440a that hold the input data (or symbol) samples and four extrinsic information memories 445 that hold the extrinsic information (i.e., $\lambda$ values) generated in each half iteration of the turbo decoder. The eight memory blocks are divided into four groups. Each memory group includes one input data memory 440 and one extrinsic information memory 445. By way of example, input data memory 440a and extrinsic information memory 445a form a first memory group, input data memory 440b and extrinsic information memory 445b form a second memory group, and so forth.

Each one of processing units 430a-430d reads and writes to one memory group at a time. Each one of processing units 430a-430d is capable of writing to each one of the memory groups. Thus, none of the memory groups is dedicated to a specific processing unit 430. For example, processing unit 430a may be connected by communication switch 420 to a first memory group (e.g., memories 440a and 445a) during one memory cycle and may read from or write to another memory group (e.g., memories 440c and 445c) during another memory cycle.

Communication switch 420 dynamically controls the connections between processing units 430a-430d and the memory groups comprised of memories 440a-440d and memories 445a-445d. The connection order or pattern is determined by the operation of address generator 415. Thus, communication switch 420 performs the interleaver and deinterleaver operations for a MAP decoder. In one embodiment of the disclosure, address generator 415 may be implemented by a memory. In such an embodiment, the external control DSP/MCU, such as MCU 370, pre-computes offline the interleaver pattern of the turbo decoder and writes the interleaver pattern to the memory of address generator 415 during an initialization phase. In another embodiment of the disclosure, address generator 415 may be designed to generate the interleaver pattern in real time. According to the principles of the disclosure, MAP datapaths 432a-d are reconfigurable devices that may be modified to operate in turbo decoders or other types of decoders and may be modified to operate under different RF protocols. Thus, MAP datapaths 432a-d provide a generic architecture to support not only α (alpha), β (beta), λ (lambda), and γ (gamma) calculations, but also to support different communication systems that use MAP decoders.

Figure 4B:
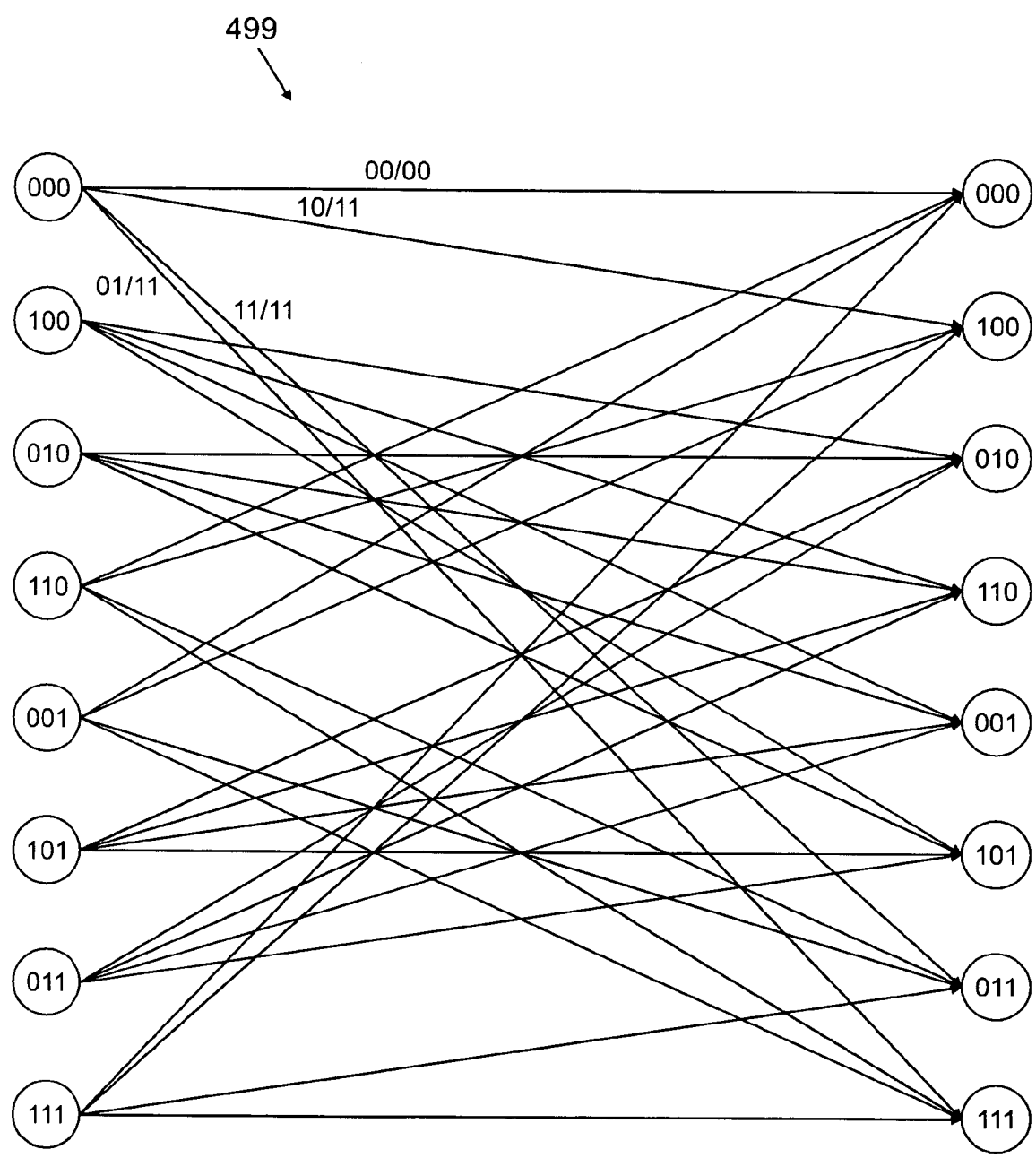
FIG. 4B is an exemplary trellis diagram for a WiBro wireless network.

A MAP algorithm may be represented by a trellis. Different communication systems, such as WCDMA, WiBro, or the like, use different trellises. FIG. 4B illustrates exemplary trellis 499 for a WiBro wireless network that may be implemented by reconfigurable MAP datapaths 432a-d. Inside trellis 499 in FIG. 4B, alpha, beta and lambda are calculated in either the forward direction or the backward direction. It is noted that there are eight states in trellis 499 and that there are four paths leading from a state at time t to a state at time t+1. This means there are 32 possible paths between states in trellis 499.

A conventional turbo encoder uses two constituent encoders. A first encoder receives an original bit stream and generates a first parity bit stream. A second encoder receives an interleaved copy of the original bit stream and generates a second parity bit stream. The data transmitted by the turbo encoder comprises the original bit stream, the first parity bits from the first encoder, and the second parity bits from the second encoder.

As is well known, a MAP algorithm is a trellis decoding algorithm, similar to the Viterbi algorithm. The MAP algorithm within the two decoder blocks operates on soft inputs (i.e., the demodulator outputs and the probability estimates) and produces soft outputs. The following description summarizes the MAP algorithm computations performed by one iteration of one decoder block. It should be noted that the exemplary turbo decoder processes two (2) input symbols at a time. In the case of duobinary code (i.e., WiBro mode), the two input symbols to turbo decoder 600 are a, b, y, w, y' and w' from a single time sample. In the case of binary code (i.e., WCDMA mode), the inputs to the turbo decoder are $x_1$, $y_1$, and $y'_1$ from a first time sample and $x_2$, $y_2$, and $y'_2$ from a second time sample. Processing two input symbols at a time requires a radix-4 trellis mechanism, as shown in FIG. 4B.

In a first step, a conventional MAP algorithm may compute and store branch metrics, called gamma (or γ) values, for all branches of the trellis. Alternatively, in the first step, the MAP algorithm may perform an "on-the-fly" calculation of the branch metric for each alpha stage or beta stage. The branch metrics are the exponentials of the negatives of the distances between the hard encoder values and the soft received values from the demodulator, divided by the channel noise variance, multiplied by the probability estimate from the previous decoder. In the logarithmic domain, the branch metric (gamma) values are merely the summation of the above parameters.

In a second step, the conventional MAP algorithm performs a forward recursion on the trellis. The forward recursion computes an alpha (or α) value for each node in the trellis. The α value is the sum of: i) the previous a value times the branch metric along one branch from a previous node, ii) the previous α value times the branch metric along another branch from a previous node, iii) the previous α value times the branch metric along one branch from another previous node, and iv) the previous α value times the branch metric along another branch from a previous node. In the logarithmic domain, the alpha values are the summation of the above parameters and finding the survivor between the four candidates, as described below.

In a third step, the conventional MAP algorithm performs a backward recursion on the trellis. The backward recursion computes a beta (or β) value for each node in the trellis. The β values are computed in a manner similar to the α values, except that the backward recursion starts at the end of the trellis and progresses in the reverse direction.

In a fourth step, the conventional MAP algorithm computes the log likelihood ratio (LLR), or λ (lambda) value, for each time t. In the case of a binary code, this value is the sum of the products of the α, β, and γ values for each branch at time t that is associated with a Logic 1 value in the encoder, divided by the sum of the products of the α, β, and γ values for each branch at time t that is associated with a Logic 0 value in the encoder. In the case of a duobinary code, there are four (4) λ (lambda) values for each time t: $\lambda_{00}$, $\lambda_{01}$, $\lambda_{10}$, $\lambda_{11}$. The $\lambda_{00}$ value is the sum of the products of the α, β, and γ values for each branch at time t that is associated with a Logic "00" value in the encoder. The $\lambda_{01}$ value is the sum of the products of the α, β, and γ values for each branch at time t that is associated with a Logic "01" value in the encoder. The $\lambda_{10}$ value is the sum of the products of the α, β, and γ values for each branch at time t that is associated with a Logic "10" value in the encoder. The $\lambda_{11}$ value is the sum of the products of the α, β, and γ values for each branch at time t that is associated with a Logic "11" value in the encoder.

Usually all lambdas are normalized by the L00 value and only three (3) lambdas—L01, L10, and L11—are saved and used for the next half iteration. Finally, the conventional MAP algorithm computes the extrinsic information that is to be sent to the next decoder in the iteration sequence. For binary code (i.e., WCDMA), the extrinsic information is the LLR value minus the input probability estimate. The computations described above are repeated in each iteration by each of the two decoder blocks. After all iterations are completed, decoded information bits may be detected by making a decision on each data bit or data pair. Alternatively, in both codes, the LLR values may be output to an external device that makes a decision on each data bit or data pair.

The present disclosure introduces a new parameter <Δ> (i.e., <delta>) that is used as a stopping criterion for both duobinary data and binary data. The parameter <Δ> is defined as the averaged difference between the largest (max) value and the second (2nd) largest value of the set: ($\lambda_{00}$, $\lambda_{01}$, $\lambda_{10}$, $\lambda_{11}$). For binary data (i.e., WCDMA), two independent data bits (i.e., two sequential data bits) are treated as a bit pair and are processed together, in the same manner as a duobinary data pair (e.g., WiBro), using a radix-4 trellis mechanism as in FIG. 4B. The symbol "< >" denotes the average over one data block of N bit pairs as follows:

$$<\Delta> \equiv \frac{1}{N} \sum_{k=0}^{N-1} \max(\lambda_{00}, \lambda_{01}, \lambda_{10}, \lambda_{11}) - 2nd(\lambda_{00}, \lambda_{01}, \lambda_{10}, \lambda_{11}). \quad \text{[Eqn. 1]}$$

Since the second largest value is subtracted from the largest value, the parameter <Δ> is never negative. Advantageously, each one of processing unit 430a-d is operable to calculate the value of <Δ> during each iteration of the MAP algorithm.

The single-bit log-likelihoods for a bit pair {a,b} of binary data (i.e., WCDMA) are given by:

$$\lambda_a = \max(\lambda_{00}, \lambda_{10}) - \max(\lambda_{01}, \lambda_{11}), \text{ and} \quad [\text{Eqn. 2}]$$

$$\lambda_b = \max(\lambda_{00}, \lambda_{01}) - \max(\lambda_{10}, \lambda_{11}). \quad [\text{Eqn. 3}]$$

Due to the trellis structure, even for low signal-to-noise ratio (SNR), the maximum of $(\lambda_{00}, \lambda_{01}, \lambda_{10}, \lambda_{11})$ is well separated from the three other log-likelihoods, which are clustered together. It follows that averaging the absolute values of $\lambda_a$ and $\lambda_b$ in Equations 2 and 3 will, in practice, yield a result that is very close to $<\Delta>$ in Equation 1. This is demonstrated by the simulation results illustrated in FIGS. 5-8, which show that the value $<\Delta>$ behaves almost identically to the value $<|\Lambda|>$, the block averaged absolute value of the single-bit log-likelihoods.

Figure 5:
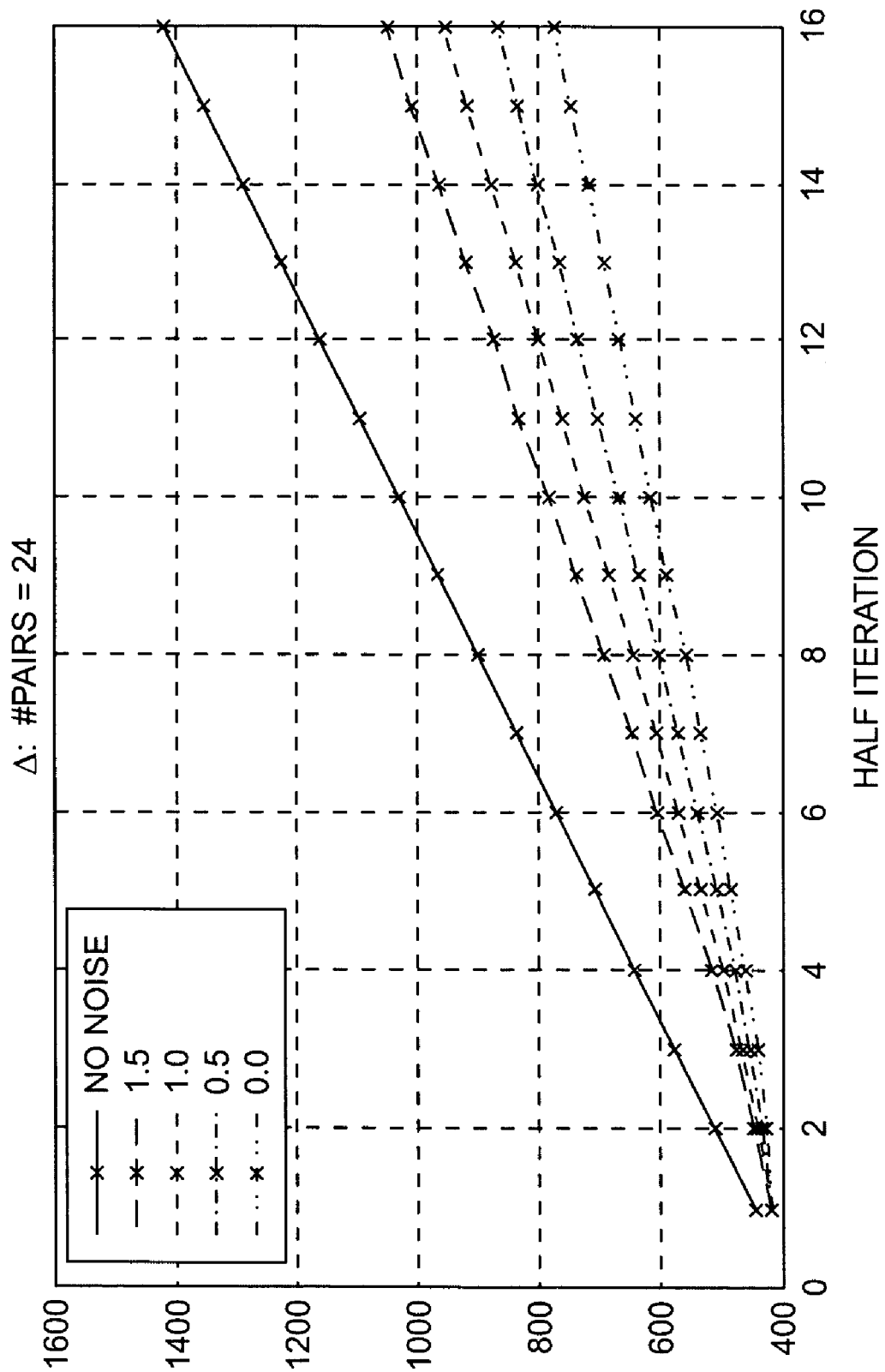
FIG. 5 illustrates the value of $\Delta$ for duobinary data over a half iteration for a block size of 24 pairs (48 bits)
Figure 6:
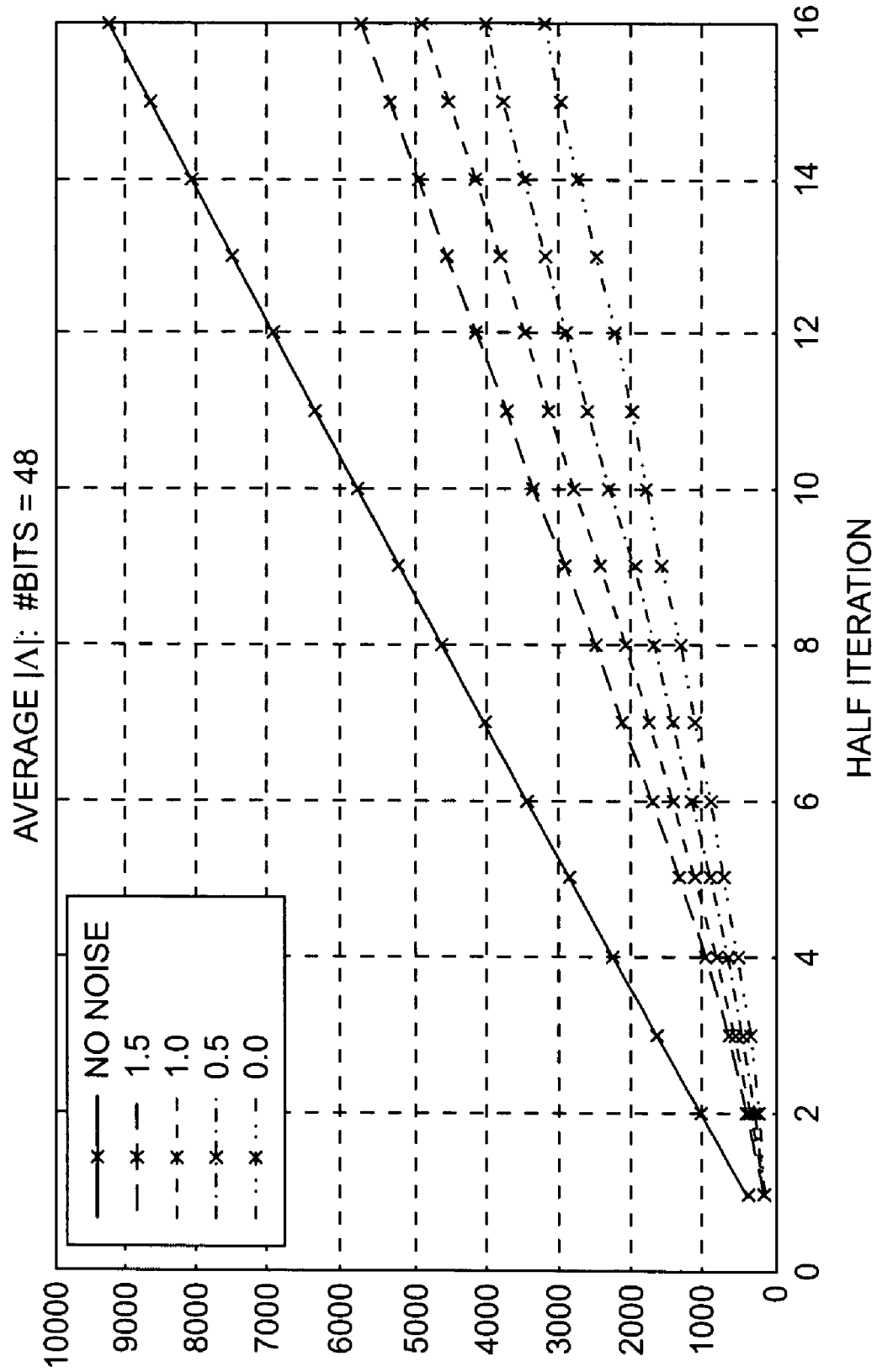
FIG. 6 illustrates the value of the single bit $<|\Delta|>$ for binary data over a half iteration for a block size of 48 bits.
Figure 7:
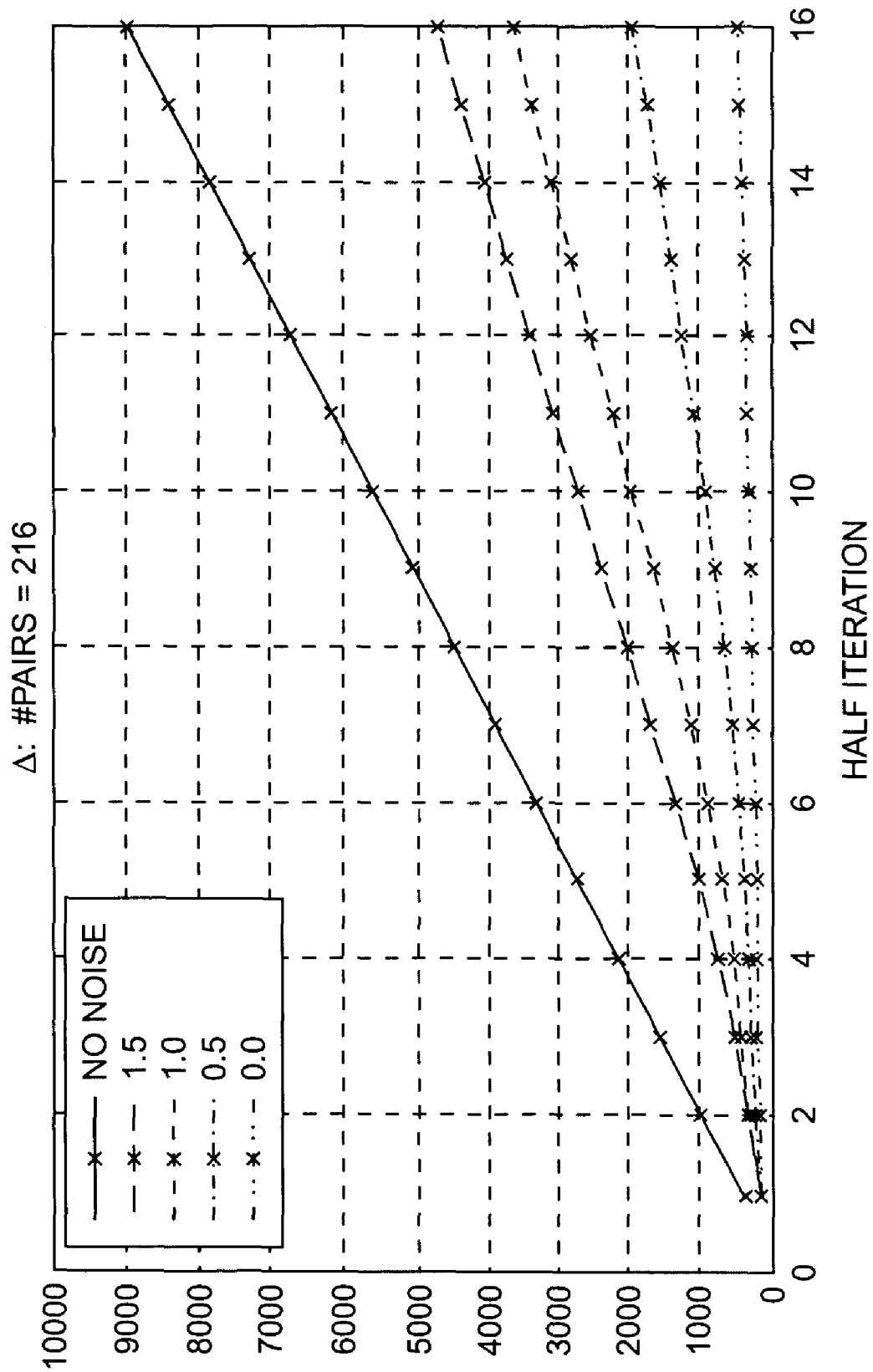
FIG. 7 illustrates the value of $\Delta$ for duobinary data over a half iteration for a block size of 216 pairs (432 bits)
Figure 8:
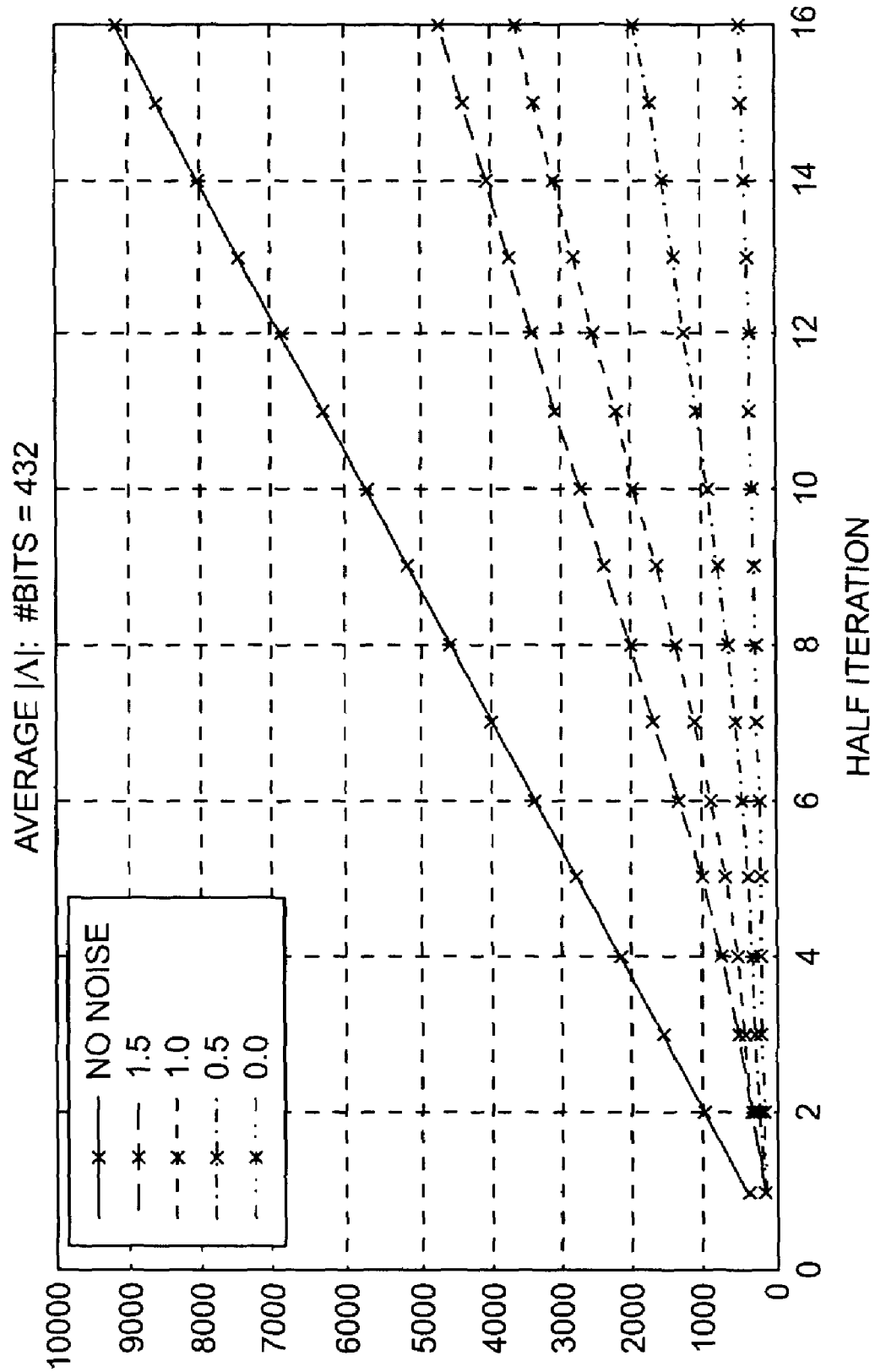
FIG. 8 illustrates the value of the single bit $<|\Delta|>$ for binary data over a half iteration for a block size of 432 bits.

FIGS. 5-8 depict the simulation results as a function of a half-iteration for various levels of noise and block sizes of 48 bits and 432 bits. FIG. 5 illustrates the value of $\Delta$ for duobinary data over a half-iteration for a block size of 24 pairs (48 bits). FIG. 6 illustrates the value of the single bit $<|\Lambda|>$ for binary data over a half-iteration for a block size of 48 bits. FIG. 7 illustrates the value of $\Delta$ for duobinary data over a half-iteration for a block size of 216 pairs (432 bits). FIG. 8 illustrates the value of the single bit $<|\Lambda|>$ for binary data over a half-iteration for a block size of 432 bits. It follows that the same stopping rules that apply to binary turbo coding based on the value $<|\Lambda|>$ may be applied to duobinary turbo coding, by simply replacing $<|\Lambda|>$ with $<\Delta>$.

Figure 9:
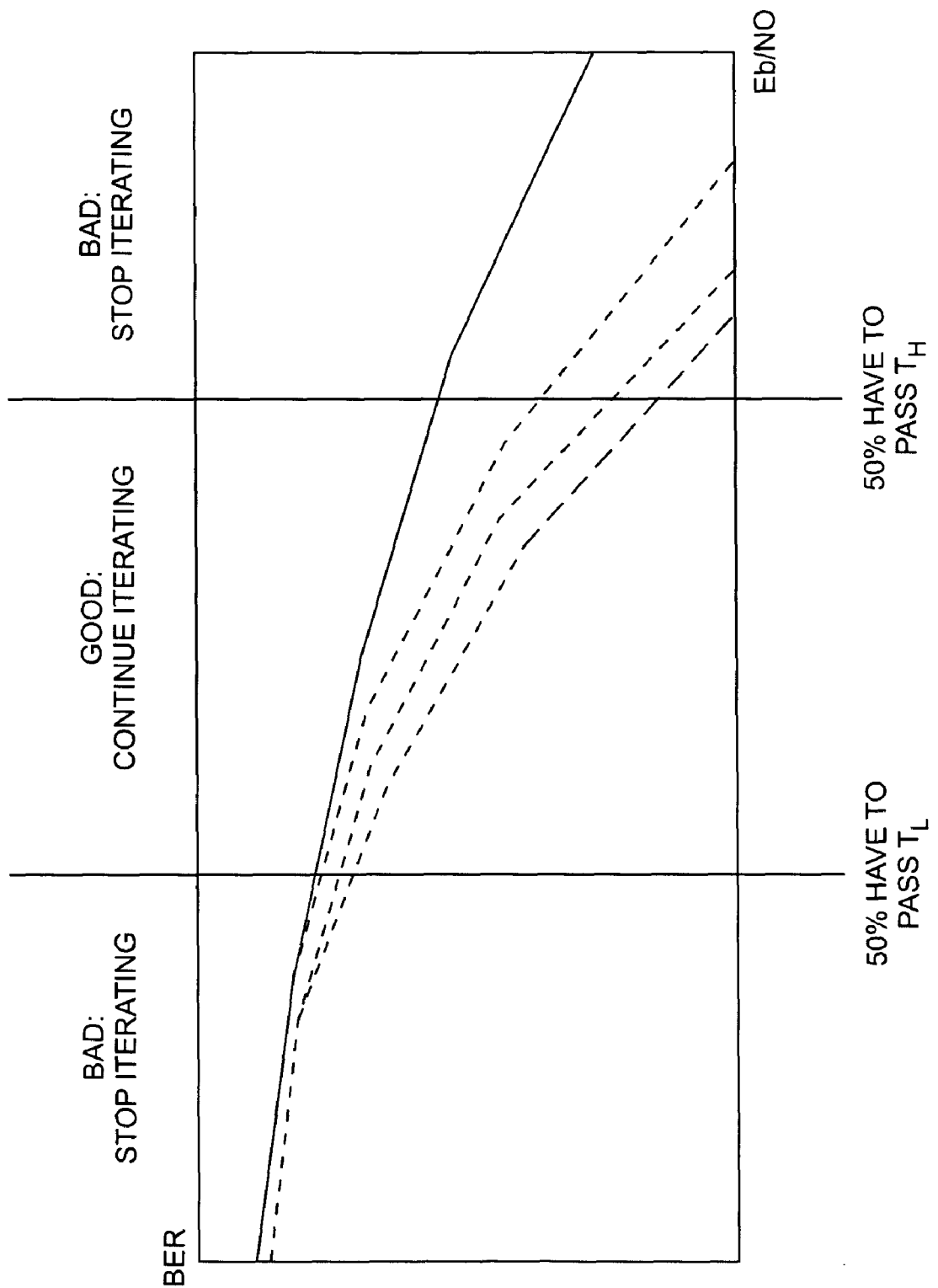
FIG. 9 illustrates the behavior of the bit error rate (BER) as a function of Eb/N0.

The bit-error rate (BER) may be defined as having three signal-to-noise ratio (SNR) regions: a low SNR region, a medium SNR region, and a high SNR region. FIG. 9 illustrates the behavior of the bit error rate (BER) as a function of SNR (i.e., Eb/N0). In the low SNR region, additional decoding iterations do not improve performance. Therefore, the decoding process is stopped. In the medium SNR region, the BER improves with additional decoding iterations. Therefore, the decoding process continues. In the high SNR region, the target BER is quickly reached. Therefore, the decoding process stops after only a few iterations.

The present disclosure uses an upper and a lower threshold as stopping criteria. The upper and lower thresholds, $T_L$ and $T_H$, respectively, are block-size independent and do not require prior knowledge of the SNR. Processing unit 430 stops the decoding process unless 50% of the $\Lambda$ values for all the pairs of binary data or duobinary data pairs lie between $T_L$ and $T_H$ for two consecutive iterations or the decoding process. Setting two thresholds ensures that iterations continue if and only if: a) the iteration process is improving the bit error rate and b) the desired target bit error rate has not been reached yet. Processing unit 430 may also compare the current $<\Delta>$ value to the previous (half) iteration $<\Delta>$ value and stop the decoding if the $<\Delta>$ value has decreased or the differences between the $<\Delta>$ values did not pass a certain value (i.e., a slope value).

This stopping criterion can be used in a unified binary and duobinary scheme. In both binary and duobinary turbo decoding, the values of the log-likelihood $\lambda$ for each systematic bit (or pair, respectively) are calculated using the forward state metric, $\alpha$, the reverse state metric, $\beta$, and the branch metric, $\gamma$. The branch metric is given by $$\gamma = \vec{u} \cdot \vec{v} + l_a, \quad [\text{Eqn. 4}]$$

where $\vec{u}$ symbolizes the received systematic and parity bits pertaining to a given systematic bit (or bit pair), $\vec{v}$ symbolizes the expected values for systematic and parity bits for a given state, and $l_a$ denotes the a-priori information for the given bit (or bit pair).

In the case of duobinary data, assuming that the values of the soft bits range from $-s$ to $+s$, the inner product, $\vec{u} \cdot \vec{v}$, is performed on a quartet of bits and its value ranges from $-4s$ to $+4s$ for the non-interleaved version of the block. For the interleaved version, the range of $\vec{u} \cdot \vec{v}$ is $-2s$ and to $+2s$, since the two systematic bits out of the quartet of four bits are set to 0.

Excluding the a-priori information, the maximal value of $\gamma$ is $4s$ (or $2s$ for the interleaved version) and the second largest value is 0. The values $\alpha$ and $\beta$ are calculated recursively and their values increase with pair position by the amount of $\gamma$. Excluding the a-priori information, the maximal value of $\alpha$ is upper-bounded by $(4s*k)$, since the maximal value for $\gamma$ has been accumulated k times. The second largest value that $\alpha$ can possibly assume for a given pair is at least $4s$ less than the largest value of $\alpha$. Similar arguments hold for $\beta$.

For a given pair at location k, the maximal value that the log-likelihood assumes increases with each half iteration by the amount of $\max(\alpha + \beta + \gamma)$. The second largest value that the log-likelihood can assume for a given pair is the sum of the second largest values of $\alpha$, $\beta$, and $\gamma$.

Excluding the a-priori information, it follows that the difference between the largest and second largest values of the log-likelihood for a given pair is upper bounded by $3*4s*i$ for the non-interleaved version of the block and $3*2s*i$ for the interleaved version, where i is the half iteration counter.

In order to provide upper bounds to the a-priori information, it is noted that this part originates from the log-likelihoods of the previous half iteration. The difference between its largest and second largest values is upper bounded by $3*2s*I$ for the non-interleaved version of the block and $3*4s*i$ for the interleaved version, excluding the a-prior information.

As a result, it is determined that $<\Delta> \leq 18*s*i$ for the non-interleaved case, where the contributions of the extrinsic and intrinsic information amount to $6*s*i$ and $12*s*i$, respectively. For the interleaved version, the same upper bound for $<\Delta>$ is obtained, but the values of the extrinsic and intrinsic information are switched.

In a noiseless environment, the value $<\Delta>$ increases linearly as a function of a half-iteration and its value reaches its upper bound. In this special case, $<\Delta>$ is block size dependent. In a noisy environment, the value of $<\Delta>$ depends on the value of Eb/N0 and increases approximately linearly as a function of a half-iteration.

The lower threshold, $T_L$, is determined as follows. In the first half-iteration, the value of the extrinsic information is 0. Thus, the initial value of $<\Delta>$ is purely intrinsic in nature. From the simulation results in FIGS. 5-8, it is noted that this initial value is around 100 for typical values of Eb/N0. After i half-iterations, if the average extrinsic value is positive, the value $<\Delta>$ should have increased to at least i times its initial value. If the value $<\Delta>$ has not increased as expected, the extrinsic information supplied by the second MAP decoder did not increase the confidence level of a decoded pair and the decoding process should be stopped. Using the simulation results, the minimal expected value of $<\Delta>$ after one full iteration is on the order 200. In the turbo decoder in FIG. 4A, the lower threshold is checked after one full iteration and hence $T_L$ is set to 0x100. The upper threshold, $T_H$, is set to the value that $<\Delta>$ assumes in the absence of noise after three full iterations. According to the simulation results in FIGS. 5-8, this value is approximately equal to 0x640.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A decoding process for decoding a received block of N systematic binary data samples or N systematic duobinary data samples using a maximum a posteriori probability (MAP) decoding algorithm, the decoding process comprising the steps of:
   a) for each of N/2 pairs of systematic binary data samples in the received block or each of N/2 pairs of duobinary data samples in the received block, calculating a set of four log-likelihood ($\lambda_{00}$, $\lambda_{01}$, $\lambda_{10}$, $\lambda_{11}$) values using the corresponding forward state metric ($\alpha$) values, reverse state metric ($\beta$) values, and branch metric ($\gamma$) values;
   b) for each set of four log-likelihood ($\lambda_{00}$, $\lambda_{01}$, $\lambda_{10}$, $\lambda_{11}$) values calculated in step a), calculating a delta value corresponding to the difference between the largest and the second largest of the four log-likelihood ($\lambda_{00}$, $\lambda_{01}$, $\lambda_{10}$, $\lambda_{11}$) values in each set;
   c) repeating steps a) and b) for at least a second iteration; and
   d) stopping the decoding process based on a plurality of delta values calculated during two consecutive iterations of steps a) and b).

2. The decoding process as set forth in claim 1, wherein the step of stopping the decoding process comprises stopping the decoding process if: i) the bit error rate is improving with each iteration of steps a) and b); and ii) a target bit error rate has not been reached yet.

3. The decoding process as set forth in claim 1, wherein the step of stopping the decoding process comprises the sub-steps of:
   determining whether a first selected percentage of the delta values during each of the two consecutive iterations of steps a) and b) exceeds a minimum threshold; and
   stopping the decoding process if the first selected percentage of the delta values during each of the two consecutive iterations does not exceed the minimum threshold.

4. The decoding process as set forth in claim 3, wherein the step of stopping the decoding process further comprises the sub-steps of:
   determining whether a second selected percentage of the delta values during each of the two consecutive iterations of steps a) and b) exceeds a maximum threshold; and
   stopping the decoding process if the second selected percentage of the delta values during each of the two consecutive iterations exceeds the maximum threshold.

5. The decoding process as set forth in claim 4, wherein the first selected percentage is 50%.

6. The decoding process as set forth in claim 5, wherein the second selected percentage is 50%.

7. A reconfigurable maximum a posteriori probability (MAP) block decoder for decoding a received block of N systematic binary data samples or N systematic duobinary data samples, wherein the reconfigurable MAP block decoder executes a decoding process capable of:
   a) calculating a set of four log-likelihood ($\lambda_{00}$, $\lambda_{01}$, $\lambda_{10}$, $\lambda_{11}$) values using forward state metric ($\alpha$) values, reverse state metric ($\beta$) values, and branch metric ($\gamma$) values associated with one of: i) each of N/2 pairs of systematic binary data samples in the received block, or ii) each of N/2 pairs of duobinary data samples in the received block;
   b) calculating, for each set of four log-likelihood ($\lambda_{00}$, $\lambda_{01}$, $\lambda_{10}$, $\lambda_{11}$) values, a delta value corresponding to the difference between the largest and the second largest of the four log-likelihood ($\lambda_{01}$, $\lambda_{01}$, $\lambda_{10}$, $\lambda_{11}$) values in each set; and
   c) repeating steps a) and b) for at least a second iteration; and
   wherein the reconfigurable MAP block decoder stops the decoding process based on a plurality of delta values calculated during two consecutive iterations of steps a) and b).

8. The reconfigurable MAP block decoder as set forth in claim 7, wherein the reconfigurable MAP block decoder stops the decoding process if: i) the bit error rate is improving with each iteration of steps a) and b); and ii) a target bit error rate has not been reached yet.

9. The reconfigurable MAP block decoder as set forth in claim 7, wherein the reconfigurable MAP block decoder is capable of i) determining whether a first selected percentage of the delta values during each of the two consecutive iterations of steps a) and b) exceeds a minimum threshold and ii) stopping the decoding process if the first selected percentage of the delta values does not exceed the minimum threshold.

10. The reconfigurable MAP block decoder as set forth in claim 9, wherein the reconfigurable MAP block decoder is capable of i) determining whether a second selected percentage of the delta values during each of the two consecutive iterations of steps a) and b) exceeds a maximum threshold and ii) stopping the decoding process if the second selected percentage of the delta values exceeds the maximum threshold.

11. The reconfigurable MAP block decoder as set forth in claim 10, wherein the first selected percentage is 50%.

12. The reconfigurable MAP block decoder as set forth in claim 11, wherein the second selected percentage is 50%.

13. A turbo decoder comprising N processing units operating independently such that a first of the N processing units decodes received data while a second of the N processing units may be disabled, wherein each of the N processing units comprises a reconfigurable maximum a posteriori probability (MAP) block decoder for decoding a received block of N systematic binary data samples or N systematic duobinary data samples, wherein the reconfigurable MAP block decoder executes a decoding process capable of:
   a) calculating a set of four log-likelihood ($\lambda_{00}$, $\lambda_{01}$, $\lambda_{10}$, $\lambda_{11}$) values using forward state metric ($\alpha$) values, reverse state metric ($\beta$) values, and branch metric ($\gamma$) values associated with one of: i) each of N/2 pairs of systematic binary data samples in the received block, or ii) each of N/2 pairs of duobinary data samples in the received block;
   b) calculating, for each set of four log-likelihood ($\lambda_{00}$, $\lambda_{01}$, $\lambda_{10}$, $\lambda_{11}$) values, a delta value corresponding to the difference between the largest and the second largest of the four log-likelihood ($\lambda_{00}$, $\lambda_{01}$, $\lambda_{10}$, $\lambda_{11}$) values in each set; and
   c) repeating steps a) and b) for at least a second iteration;
   wherein the reconfigurable MAP block decoder stops the decoding process based on a plurality of delta values calculated during two consecutive iterations of steps a) and b).

14. The reconfigurable turbo decoder as set forth in claim 13, wherein the reconfigurable MAP block decoder stops the decoding process if: i) the bit error rate is improving with each iteration of steps a) and b); and ii) a target bit error rate has not been reached yet.

15. The reconfigurable turbo decoder as set forth in claim 13, wherein the reconfigurable MAP block decoder is capable of i) determining whether a first selected percentage of the delta values during each of the two consecutive iterations of steps a) and b) exceeds a minimum threshold and ii) stopping the decoding process if the first selected percentage of the delta values does not exceed the minimum threshold.

16. The reconfigurable turbo decoder as set forth in claim 15, wherein the reconfigurable MAP block decoder is capable of i) determining whether a second selected percentage of the delta values during each of the two consecutive iterations of steps a) and b) exceeds a maximum threshold and ii) stopping the decoding process if the second selected percentage of the delta values exceeds the maximum threshold.

17. The reconfigurable turbo decoder as set forth in claim 16, wherein the first selected percentage is 50%.

18. The reconfigurable turbo decoder as set forth in claim 17, wherein the second selected percentage is 50%.

19. A software-defined radio (SDR) system capable of operating under a plurality of wireless communication standards, the SDR system comprising a reconfigurable maximum a posteriori probability (MAP) block decoder for decoding a received block of N systematic binary data samples or N systematic duobinary data samples, wherein the reconfigurable MAP block decoder executes a decoding process capable of:
  a) calculating a set of four log-likelihood ($\lambda_{00}$, $\lambda_{01}$, $\lambda_{10}$, $\lambda_{11}$) values using forward state metric ($\alpha$) values, reverse state metric ($\beta$) values, and branch metric ($\gamma$) values associated with one of: i) each of N/2 pairs of systematic binary data samples in the received block, or ii) each of N/2 pairs of duobinary data samples in the received block;
  b) calculating, for each set of four log-likelihood ($\lambda_{00}$, $\lambda_{01}$, $\lambda_{10}$, $\lambda_{11}$) values, a delta value corresponding to the difference between the largest and the second largest of the four log-likelihood ($\lambda_{00}$, $\lambda_{01}$, $\lambda_{10}$, $\lambda_{11}$) values in each set; and
  c) repeating steps a) and b) for at least a second iteration;
  wherein the reconfigurable MAP block decoder stops the decoding process based on a plurality of delta values calculated during two consecutive iterations of steps a) and b).

20. The SDR system as set forth in claim 19, wherein the reconfigurable MAP block decoder stops the decoding process if: i) the bit error rate is improving with each iteration of steps a) and b); and ii) a target bit error rate has not been reached yet.

21. The SDR system as set forth in claim 19, wherein the reconfigurable MAP block decoder is capable of i) determining whether a first selected percentage of the delta values during each of the two consecutive iterations of steps a) and b) exceeds a minimum threshold and ii) stopping the decoding process if the first selected percentage of the delta values does not exceed the minimum threshold.

22. The SDR system as set forth in claim 21, wherein the reconfigurable MAP block decoder is capable of i) determining whether a second selected percentage of the delta values during each of the two consecutive iterations of steps a) and b) exceeds a maximum threshold and ii) stopping the decoding process if the second selected percentage of the delta values exceeds the maximum threshold.

23. The SDR system as set forth in claim 22, wherein the first selected percentage is 50%.

24. The SDR system as set forth in claim 23, wherein the second selected percentage is 50%.

* * * * *